United States Patent
Racov et al.

(10) Patent No.: US 9,770,821 B2
(45) Date of Patent: Sep. 26, 2017

(54) BATTERY OPERATED HANDHELD POWER TOOL

(75) Inventors: Mikael Racov, Huskvarna (SE); Johan Svennung, Jönköping (SE); Mikael Arvidsson, Huskvarna (SE)

(73) Assignee: HUSQVARNA AB, Huskvarna (SE)

( * ) Notice: Subject to any disclaimer, the term of this patent is extended or adjusted under 35 U.S.C. 154(b) by 575 days.

(21) Appl. No.: 14/349,781

(22) PCT Filed: Oct. 6, 2011

(86) PCT No.: PCT/SE2011/051197
§ 371 (c)(1),
(2), (4) Date: Apr. 4, 2014

(87) PCT Pub. No.: WO2013/051972
PCT Pub. Date: Apr. 11, 2013

(65) Prior Publication Data
US 2014/0246214 A1   Sep. 4, 2014

(51) Int. Cl.
*B25F 5/02* (2006.01)
*B25F 5/00* (2006.01)
(Continued)

(52) U.S. Cl.
CPC .......... *B25F 5/008* (2013.01); *A01D 34/4163* (2013.01); *A01D 34/902* (2013.01);
(Continued)

(58) Field of Classification Search
CPC .... B25F 5/00; B25F 5/02; B25F 5/001; B25F 5/008; B25F 3/00; B25D 16/00;
(Continued)

(56) References Cited

U.S. PATENT DOCUMENTS 3,959,879 A * 6/1976 Sellers .................. A01D 34/84
30/276
4,089,114 A * 5/1978 Doolittle .............. A01D 34/416
30/122
(Continued)

FOREIGN PATENT DOCUMENTS

CN        101305404 A      11/2008
CN        201146705 Y      11/2008
(Continued)

OTHER PUBLICATIONS

International Search Report and Written Opinion of PCT/SE2011/051197 mailed Jun. 15, 2012, all enclosed pages cited.
(Continued)

*Primary Examiner* — Scott A. Smith
(74) *Attorney, Agent, or Firm* — McNair Law Firm, P.A.

(57) ABSTRACT

A battery operated handheld power tool, the power tool (1) comprising a working tool assembly (20), comprising a working tool of the power tool and an electric motor, arranged to drive the working tool, a handle assembly (10), comprising a body portion (11) to which a battery pack (13) may be detachably connected, which battery pack (13) is arranged to provide electric power to the electric motor, a control unit (15), provided in the body portion (16) so as to control a flow of electric current from the battery pack (13) to the motor. The battery operated handheld power tool is characterized in that the body portion (11) comprises a fan (14), arranged to generate a flow of air passing by the control unit (15) during operation of the power tool (1).

15 Claims, 1 Drawing Sheet

(51) Int. Cl.
*A01D 34/416* (2006.01)
*H02K 5/20* (2006.01)
*H02K 9/06* (2006.01)
*A01D 34/90* (2006.01)
*A01D 69/02* (2006.01)
*H05K 7/20* (2006.01)

(52) U.S. Cl.
CPC ............... *A01D 69/02* (2013.01); *H02K 5/20* (2013.01); *H02K 9/06* (2013.01); *H05K 7/20* (2013.01)

(58) Field of Classification Search
CPC ........ B25D 17/20; H02K 5/148; H02K 11/28; H02K 11/33; H02K 23/08; H02K 23/30; H02K 23/66; H02K 7/20; H02K 9/06; H02K 5/20; A01D 34/78; A01D 34/84; A01D 34/90; A01D 34/902; A01D 34/416; A01D 34/4163; A01D 69/02
USPC .... 173/217, 117, 170, 213, 171; 310/47, 50, 310/58, 36; 320/107, 150; 318/276, 246, 318/268, 446, 490; 30/276, 122, 208, 30/210, 296.1, 340, 517
See application file for complete search history.

(56) References Cited

U.S. PATENT DOCUMENTS

| | | | | |
|---|---|---|---|---|
| 4,231,155 A * | 11/1980 | Johne | ............... | A47L 11/12 30/123.3 |
| 4,542,557 A * | 9/1985 | Levine | ............... | A47L 5/24 15/344 |
| 5,265,341 A * | 11/1993 | Kikuchi | ............... | A01D 34/902 30/276 |
| 5,809,653 A * | 9/1998 | Everts | ............... | A01D 34/90 15/328 |
| 5,816,121 A * | 10/1998 | Yoshimizu | ............... | B25B 21/008 173/176 |
| 6,014,812 A * | 1/2000 | Webster | ............... | A01D 34/4163 30/276 |
| 6,123,158 A * | 9/2000 | Steffen | ............... | H02K 11/33 173/117 |
| 6,127,751 A | 10/2000 | Kristen et al. | | |
| 6,543,549 B1 * | 4/2003 | Riedl | ............... | B25B 21/00 173/171 |
| 6,597,572 B2 | 7/2003 | Nishikawa et al. | | |
| 6,949,309 B2 | 9/2005 | Moores, Jr. et al. | | |
| 6,996,960 B1 * | 2/2006 | Flemm | ............... | A01G 3/062 30/276 |
| 7,064,462 B2 | 6/2006 | Hempe et al. | | |
| 7,243,734 B2 * | 7/2007 | Wu | ............... | H01M 2/1022 173/217 |
| 7,249,695 B2 * | 7/2007 | Shew | ............... | F16N 11/08 222/258 |
| 7,270,910 B2 * | 9/2007 | Yahnker | ............... | B25F 5/008 30/500 |
| 7,323,797 B2 | 1/2008 | Furui et al. | | |
| 7,705,497 B2 | 4/2010 | Arich et al. | | |
| 7,712,182 B2 | 5/2010 | Zeiler et al. | | |
| 7,752,760 B2 * | 7/2010 | Baskar | ............... | A01G 3/0417 30/210 |
| 7,764,502 B2 | 7/2010 | Erb et al. | | |
| 7,770,660 B2 * | 8/2010 | Schroeder | ............... | B25F 5/02 173/1 |
| 7,786,627 B2 | 8/2010 | Riedl | | |
| 8,098,036 B2 * | 1/2012 | Matsunaga | ............... | B25F 5/00 30/276 |
| 8,169,298 B2 | 5/2012 | Wiesner et al. | | |
| 8,418,780 B2 * | 4/2013 | Lau | ............... | B25F 5/008 173/171 |
| 8,627,900 B2 * | 1/2014 | Oomori | ............... | B25F 5/008 173/168 |
| 2003/0037933 A1 * | 2/2003 | Breneman | ............... | A01D 34/84 172/14 |
| 2006/0155582 A1 | 7/2006 | Brown | | |
| 2006/0222930 A1 * | 10/2006 | Aradachi | ............... | H01M 2/1055 429/96 |
| 2008/0315693 A1 | 12/2008 | Uchida | | |
| 2009/0126964 A1 * | 5/2009 | Schroeder | ............... | B25F 5/02 173/217 |
| 2009/0145621 A1 | 6/2009 | Lau et al. | | |
| 2009/0245958 A1 | 10/2009 | Lau et al. | | |
| 2010/0224667 A1 | 9/2010 | Schiestl et al. | | |
| 2011/0180286 A1 | 7/2011 | Oomori et al. | | |
| 2012/0267134 A1 | 10/2012 | Matthias et al. | | |

FOREIGN PATENT DOCUMENTS

| | | |
|---|---|---|
| CN | 101456181 A | 6/2009 |
| DE | 102009045946 A1 | 4/2011 |
| EP | 1715565 A1 | 10/2006 |
| EP | 2100702 A1 | 9/2009 |
| EP | 2371202 A2 | 10/2011 |
| WO | 2008156185 A1 | 12/2008 |
| WO | 2009145206 A2 | 12/2009 |

OTHER PUBLICATIONS

Chapter I International Preliminary Report on Patentability of PCT/SE2011/051197 mailed Apr. 8, 2014, all enclosed pages cited.

* cited by examiner

BATTERY OPERATED HANDHELD POWER TOOL

TECHNICAL FIELD

The invention relates to battery operated handheld power tools, and in particular to battery operated handheld power tools having a control unit, provided in a body portion of the tool so as to control a flow of electric current from a battery pack to a motor of the tool.

BACKGROUND OF THE INVENTION

Battery operated hand held power tools, such as grass trimmers and clearing saws are well known in the art.

In order to satisfy demanding consumers and professional users, battery operated tools having powerful motors and high capacity batteries are requested. In such high capacity tools a lot of heat may be generated in a control unit of the tool, e.g. due to the high current levels used during operation of such power tools. This heat generation might lead to reduced performance, control unit failures and/or a reduced life time of the control unit.

Accordingly, there is a need for an arrangement reducing the negative impact that the use of high capacity batteries and powerful motors has on the control unit.

SUMMARY OF THE INVENTION

It is an object of the present invention to provide a battery driven power tool in which a control unit will withstand being exposed to the current levels provided by high capacity batteries and needed by high performance electric motors.

According to a first aspect of the solution, the object is at least partially achieved by means of a battery operated handheld power tool, which power tool comprises a working tool assembly, comprising a working tool of the power tool and an electric motor, arranged to drive the working tool, a handle assembly, comprising a body portion to which a battery pack may be detachably connected, which battery pack is arranged to provide electric power to the electric motor, a control unit, provided in the body portion so as to control a flow of electric current from the battery pack to the motor. The power tool is characterized in that the body portion comprises a fan, arranged to generate a flow of air passing by the control unit during operation of the power tool.

Thereby the control unit may be cooled during operation of the power tool and the negative impact of the heat generated in the control unit during operation of the power tool will be reduced. Accordingly, the risk for control unit failures will be reduced, and the life time of the control unit might be extended.

According to an embodiment, the fan is controlled by the control unit. Thereby, the fan might be controlled so as to operate only when the power tool is activated and the motor is running. In that way power consumption of the fan might be reduced. The fan might also be controlled so as to operate only during certain conditions determined by the control unit.

According to another embodiment the control unit is arranged in a control unit housing made from metal. Thereby, heat dissipation from the control unit might be enhanced.

According to an embodiment, the control unit housing is made from aluminum. Thanks to the characteristics of aluminum, it is particularly favorable in order to provide good heat dissipation.

According to an embodiment, the fan is arranged to suck ambient air from an air inlet provided in a cover of the body portion and to direct the air flow towards the control unit and further to an air outlet provided in the cover.

BRIEF DESCRIPTION OF THE DRAWINGS

The invention will be understood and appreciated more fully from the following detailed description, taken in conjunction with the drawings, in which.

DESCRIPTION OF PREFERRED EMBODIMENTS

Figure 1:
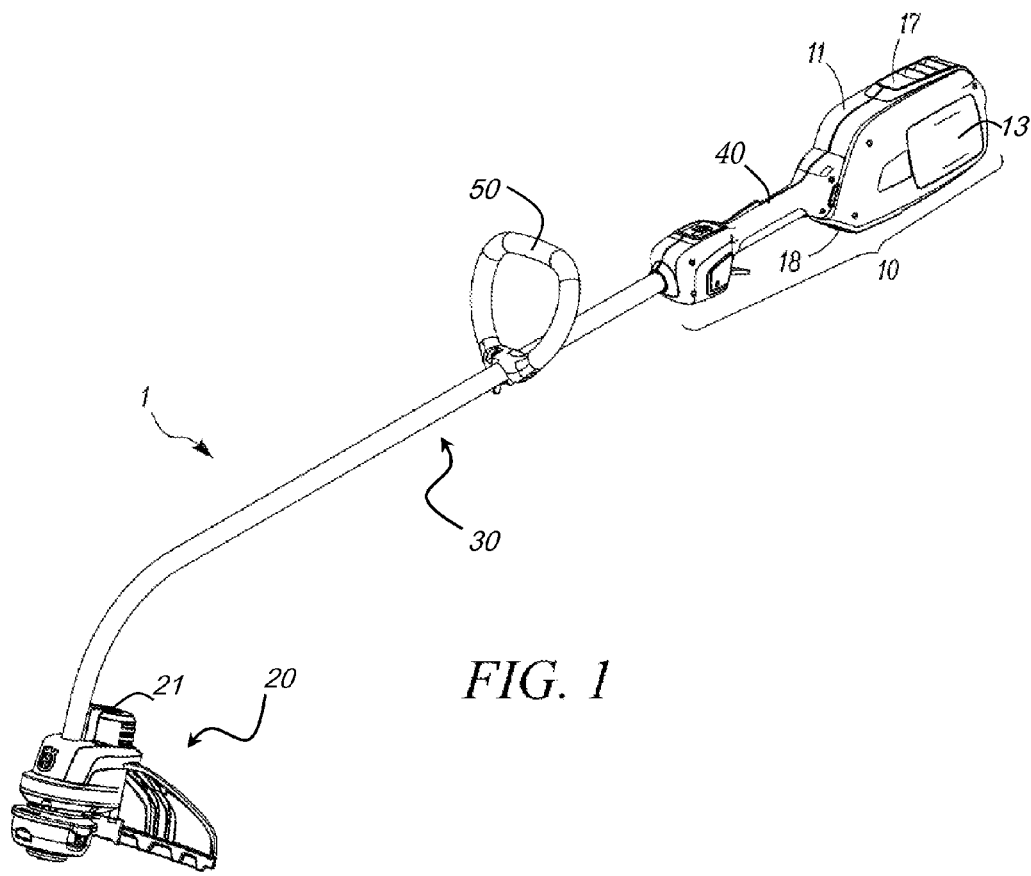
FIG. 1 is a perspective view of a battery operated handheld power tool according to an embodiment of the invention.

The present invention will be described more fully hereinafter with reference to the accompanying drawings, in which preferred embodiments of the invention are shown. The invention may, however, be embodied in many different forms and should not be construed as limited to the embodiments set forth herein; rather these embodiments are provided so that this disclosure will be thorough and complete, and will fully convey the scope of the invention to those skilled in the art. In the drawings, like numbers refer to like elements.

Referring to FIG. 1, a battery operated handheld power tool 1 embodied as a grass trimmer 1 is shown.

The trimmer 1 has a handle assembly 10, comprising a main handle 40 and a body portion 11 which is arranged to receive a battery pack 13. According to the embodiment shown in FIGS. 1 and 2, the body portion 11 has a battery receiving portion 19 embodied as a through hole 19 into which the battery pack 13 may be inserted. The battery pack 13 may e.g. comprise a plurality of rechargeable lithium ion battery cells. The battery pack is arranged to provide power to an electric motor 21 of the power tool 1.

The power tool 1 also comprises a working tool assembly 20 which in the case of a grass trimmer 1 is embodied as a cutting means assembly 20. The working tool assembly comprises a working tool of the power tool and the electric motor 21 which is arranged to drive the working tool. In the embodiment shown in FIG. 1, the working tool is a cutting means, such as a trimmer line or knife, which is connected to a rotatable cutting means carrier.

As shown in FIG. 1, an elongate rod 30 or tube 30 interconnects the handle assembly 10 and the cutting means assembly 20.

A supplementary handle 50 may be connected to the tube 30, in a position between the handle assembly 10 and the cutting means assembly 20.

According to an embodiment, the motor 21 is a BLDC motor. The motor may also be another kind of electric motor.

A control unit 15 controls operation of the electric motor 21. The control unit 15 is positioned within the body portion 11.

The control unit 15 may be arranged in a control unit housing 16. The housing may be made of a metal. According to an embodiment, the housing is made from aluminum. The control unit housing may partially enclose the control unit 15 so as to protect it and enhance heat dissipation.

During operation of the power tool, heat will be generated in the control unit 15. In order to cool the control unit, so as to reduce a negative impact of the generated heat, a fan 14 is arranged in the body portion 11.

Air inlets 17 are provided in a cover 12 of the body portion 11, so as to allow ambient air to flow into an inner space of the housing, in which the fan 14 and the control unit 15 are arranged.

The fan 14 may suck air from the air inlets 17 and direct it towards the control unit 15. Air outlets 18 may be arranged on an opposite side of the control unit, as seen from the fan 14 point of view. When the air flow has passed the control unit, the air may escape from the body portion through the air outlets 18.

The air inlets and air outlets are preferably arranged relative each other such that air flowing between them will pass the control unit.

The control unit 15 may be arranged upstream or downstream of the fan 14.

Figure 2:
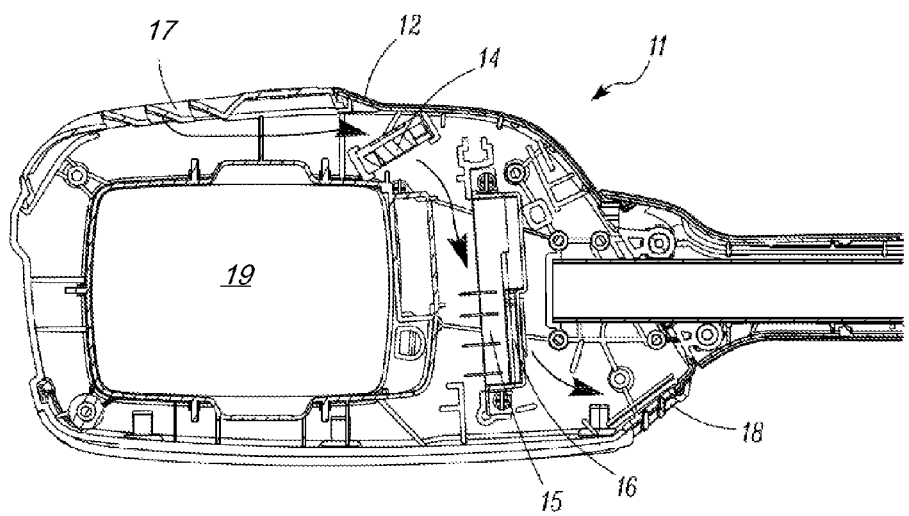
FIG. 2. is a schematic cross sectional view of a body portion of a handle assembly of the power tool in FIG. 1.

According to the embodiment shown in FIGS. 1 and 2, the air inlets are provided on a rearwardly and upwardly facing surface of the cover 12, as seen from an operator's point of view, when the power tool 1 is in a normal working position.

According to the embodiment in FIGS. 1 and 2, the air outlets are provided on a forwardly and downwardly facing surface of the cover, as seen from an operator's point of view, when the power tool 1 is in a normal working position.

According to the embodiment shown in FIG. 2, the control unit 15 is positioned downstream of the fan 14, such that the air flow generated by the fan 14 will pass the fan 14 before passing the control unit 15. The fan 14 sucks air from the outside of the housing and pushes it towards the control unit 15.

The fan 14 might also be positioned downstream of the control unit 15. In that case it might suck air from the air inlets, via the control unit, and direct the air flow towards the air outlets.

The fan 14 is preferably controlled by the control unit 15. The control unit 15, in turn, may be controlled by means of a trigger or some other kind of input device, activated by the operator.

The activation of the fan 14 may be dependent on the temperature of the control unit 15. By means of temperature sensors provided on or in the vicinity of the control unit the temperature may be registered by the control unit 15. Depending on the temperature the control unit 15 may allow activation of the fan 14.

In the drawings and specification, there have been disclosed preferred embodiments and examples of the invention and, although specific terms are employed, they are used in a generic and descriptive sense only and not for the purpose of limitation, the scope of the invention being set forth in the following claims.

The invention claimed is:

1. A battery operated handheld power tool, the power tool comprising:
    a working tool assembly comprising a working tool of the power tool and an electric motor, arranged to drive the working tool,
    a handle assembly comprising a body portion to which a battery pack is detachably connected, the battery pack being arranged to provide electric power to the electric motor, wherein the battery is received in a through hole extending completely through the body portion,
    a control unit provided in the body portion to control a flow of electric current from the battery pack to the electric motor, and
    a fan disposed in the body portion and separate from the electric motor, wherein the fan is arranged to generate a flow of air around the through hole within the body portion to pass by the control unit during operation of the power tool.

2. The battery operated handheld power tool according to claim 1, wherein the fan is controlled by the control unit.

3. The battery operated handheld power tool according to claim 2, wherein the control unit activates the fan based on a temperature of the control unit.

4. The battery operated handheld power tool of claim 3 further comprising a temperature sensor provided on the control unit to sense the temperature of the control unit.

5. The battery operated handheld power tool according to claim 1, wherein the control unit is arranged in a control unit housing made from metal.

6. The battery operated handheld power tool according to claim 5 wherein the control unit housing is made from aluminum.

7. The battery operated handheld power tool according to claim 1, wherein the fan is arranged to suck ambient air from an air inlet provided in a cover of the body portion and to direct the air flow towards the control unit and further to an air outlet provided in the cover.

8. The battery operated handheld power tool of claim 1, wherein the body portion is disposed at a proximal end of the handle assembly and the working tool assembly is disposed at a distal end of the handle assembly.

9. The battery operated handheld power tool of claim 1, wherein the body portion comprises a cover, wherein the cover comprises air inlets and air outlets.

10. The battery operated handheld power tool of claim 1, wherein the battery operated handheld power tool comprises a grass trimmer.

11. The battery operated handheld power tool of claim 1, wherein the battery is received in the through hole in a direction perpendicular to a direction of longitudinal extension of the battery operated handheld power tool.

12. The battery operated handheld power tool of claim 1, wherein the body portion comprises a cover including an outer wall and an inner wall, wherein the inner wall is defined by the through hole and the flow of air passes between the outer wall and the inner wall.

13. The battery operated handheld power tool of claim 12, wherein the outer wall comprises an air inlet and an air outlet disposed at opposite sides of the control unit.

14. The battery operated handheld power tool of claim 13, wherein the air inlet is disposed at a first end of the outer wall and the air outlet is disposed at a second end of the outer wall opposite the first end.

15. The battery operated handheld power tool of claim 13, wherein, in a working position, the air inlet are disposed in a rearward and upward facing portion of the outer wall of the cover and the air outlet are disposed in a forward and downward facing portion of the outer wall of the cover.

* * * * *